United States Patent
Mallinson

(10) Patent No.: US 6,987,475 B2
(45) Date of Patent: *Jan. 17, 2006

(54) AUDIO DIGITAL TO ANALOG CONVERTER WITH HARMONIC SUPPRESSION

(75) Inventor: Andrew Martin Mallinson, Kelowna (CA)

(73) Assignee: ESS Technology Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/115,974

(22) Filed: Apr. 26, 2005

(65) Prior Publication Data

US 2005/0219104 A1   Oct. 6, 2005

Related U.S. Application Data

(63) Continuation of application No. 10/810,314, filed on Mar. 26, 2004, now Pat. No. 6,897,795.

(60) Provisional application No. 60/458,902, filed on Mar. 28, 2003.

(51) Int. Cl.
   *H03M 3/00*   (2006.01)
(52) U.S. Cl. ........................ 341/143; 341/144
(58) Field of Classification Search ........ 341/143, 341/144, 118
   See application file for complete search history.

(56) References Cited

U.S. PATENT DOCUMENTS

| | | | | |
|---|---|---|---|---|
| 4,289,403 | A | * | 9/1981 | Allington ............... 356/491 |
| 5,363,856 | A | * | 11/1994 | Hughes et al. ........... 600/526 |
| 5,537,435 | A | * | 7/1996 | Carney et al. ........... 375/219 |
| 6,324,030 | B1 | * | 11/2001 | Cheung et al. ........ 360/77.08 |
| 6,580,314 | B1 | * | 6/2003 | Deus et al. ............... 329/306 |
| 2005/0174171 | A1 | * | 8/2005 | Oswal et al. ............. 330/69 |

* cited by examiner

*Primary Examiner*—Peguy JeanPierre
(74) *Attorney, Agent, or Firm*—Stevens Law Group, P.C.

(57) ABSTRACT

A high quality DAC is provided for a lower cost (including the layout size of the circuit on an audio chip) of high end DACs. The DAC includes a first circuit configured to remove even harmonics from a sigma delta circuit, and a second circuit configured to remove odd harmonics.

21 Claims, 3 Drawing Sheets

US 6,987,475 B2

AUDIO DIGITAL TO ANALOG CONVERTER WITH HARMONIC SUPPRESSION

RELATED APPLICATIONS AND PRIORITY

This application is a continuation of Provisional Patent Application Ser. No. 60/458,902 filed Mar. 28, 2003; and is also a continuation U.S. Non-Provisional Patent Application Ser. No. 10/810,314, Filed Mar. 26, 2004. Now U.S. Pat. No. 6,897,795.

BACKGROUND

Digital to analog converters (DACs) are fundamental building blocks for modern audio circuits, and have a large impact on the cost and performance of many products. Inexpensive low end DACs can be produced for some applications, but the cheaper DACs suffer from noise errors. In particular, error occurs in both the even and odd harmonics, resulting in a poor audio output quality. A high quality DAC can be produced to overcome these errors. But conventional high end DACs are complex and expensive.

Therefore, there exists a need for an improved audio DAC having fewer errors than conventional DACs and that are less expensive. As will be seen, the invention accomplishes this in an elegant manner.

DETAILED DESCRIPTION

The invention provides an improved audio DAC having less errors than conventional inexpensive DACs, and that are less expensive than high end DACs. The invention provides a system and method for correcting errors in low end DACs using digital signal processing. The digital signal processing provides a method for substantially removing the even and odd harmonics of the DAC output error. Thus, the performance of less complex and less expensive low end DACs can be improved using digital processing techniques. The result is a high quality DAC for a lower cost (including the layout size of the circuit on an audio chip) of high end DACs. Below is a description of the invention, which includes particular embodiments for example and illustration of the invention. The scope of the invention, however, is not limited to such embodiments, but rather is defined according to the scope of the appended claims and all equivalents.

Figure 1:
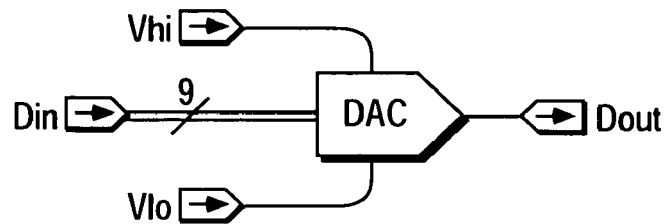
FIG. 1 is an illustration of a DAC of the prior art.

Methods for removing the even harmonics of a system's error are well known, and were known as "auto zero" in the past. In one conventional method, a chop wave is used. Considered within the frequency domain, conventional even harmonic suppression serves to move the even harmonics of the signal error to surround the chopping frequency. Referring to FIG. 1, a diagrammatic view of a conventional DAC is illustrated. This DAC outputs Vout, a voltage between Vlo and Vhi that is in proportion to the input code Din. Such a conventional DAC may have second and higher order harmonics, and may be accurate to as few as nine or ten bits.

Figure 2:
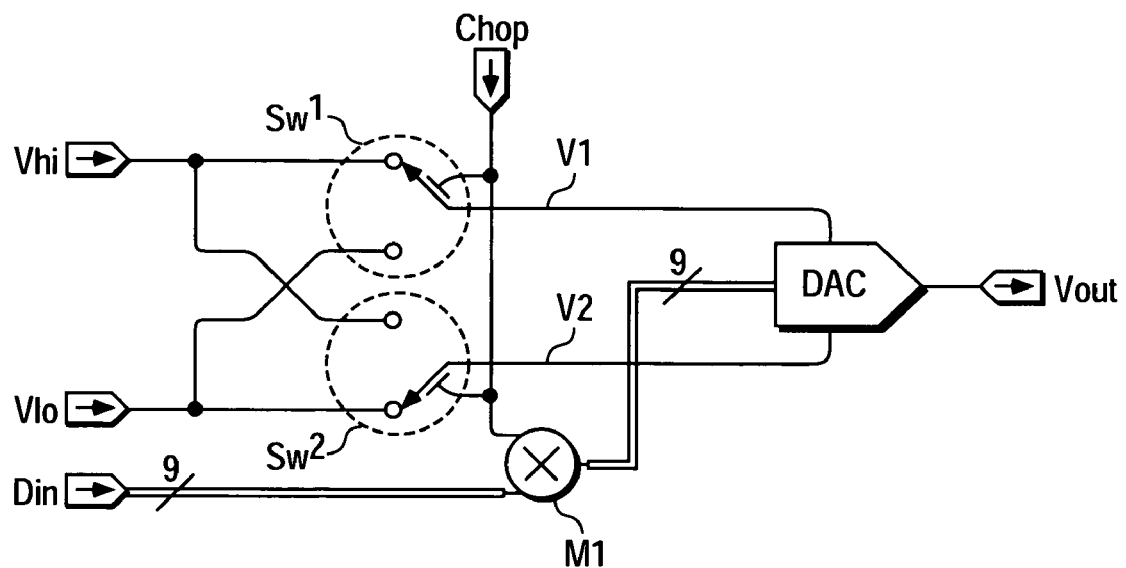
FIG. 2 is an illustration of an improved DAC according to the invention.

According to the invention, even harmonics can be removed using an improved circuit shown in FIG. 2. The DAC is configured to output Vout between V1 and V2, the high and low signal bounds of the DAC. V1 and V2 are derived from the respective switches Sw1 and Sw2. These switches oscillate according to the Chop signal, oppositely switching from Vhi to Vlo accordingly. Din multiplied by a negative 1 (or inverted) is then fed into the DAC via the multiplier M1.

In this circuit, the DAC is generating an output between Vlo and Vhi as in the conventional circuit of FIG. 1. However, this improved circuit is configured to reverse the roles of Vlo and Vhi. If these roles are reversed and, at the same instant, the input number to the DAC is negated, or multiplied by a negative 1, the even order terms, the even harmonics, are moved out of the band. These terms are moved to surround the frequency of the Chop input. For example, if the Chip input signal runs at 256 Fs, or about 10 Mhz, the even harmonic terms are moved well out of the Fs/2 frequency band.

Figure 3:
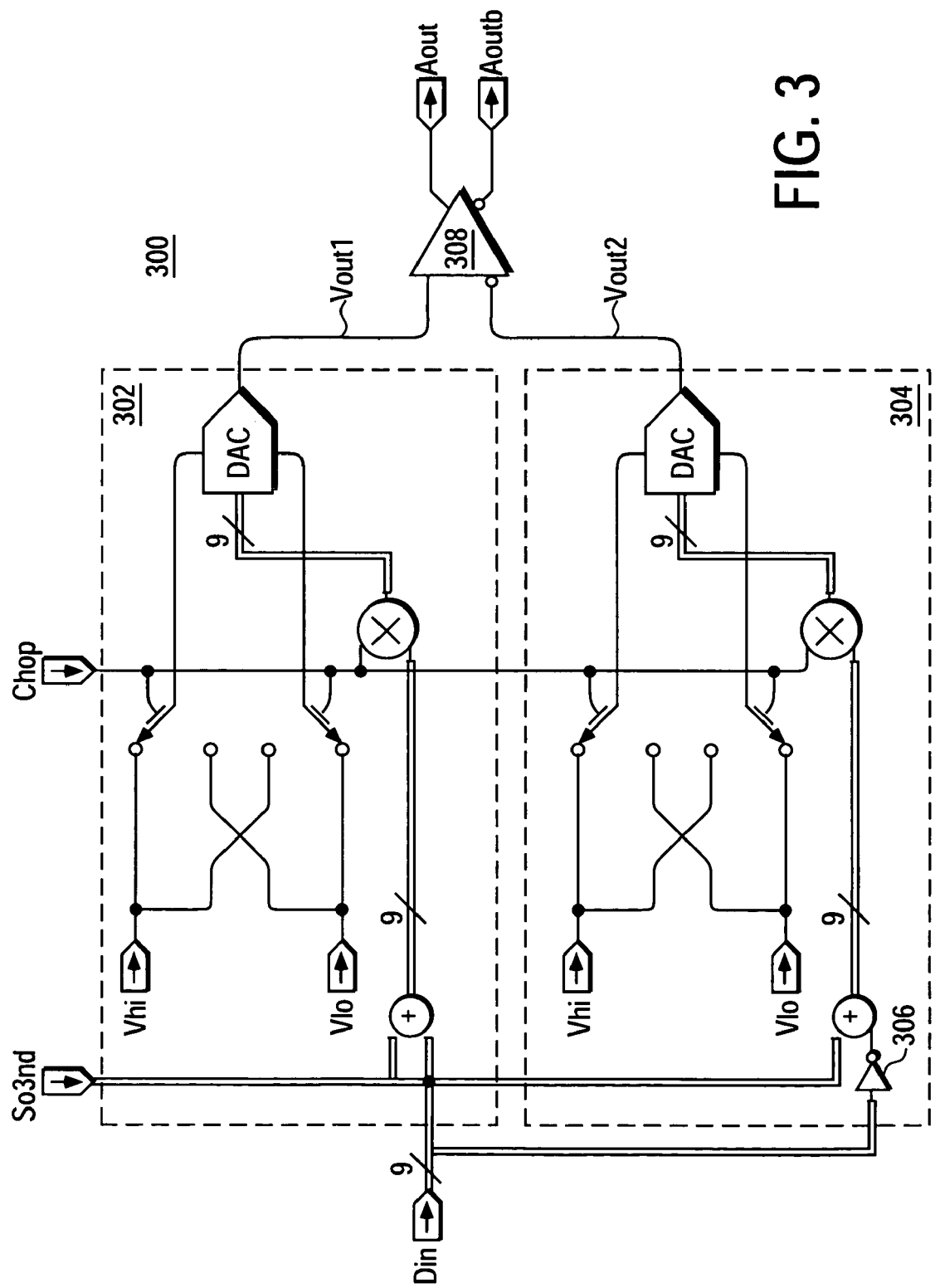
FIG. 3 is an illustration of an improved DAC according to the invention.

Referring to FIG. 3, a diagrammatic view of a circuit configured to shift both even and odd harmonics is illustrated. Essentially, the circuit 300 of FIG. 2 is duplicated and combined as a differential pair, 302, 304. The first and second circuits are driven by the input signal added to So3rd, which operates to add a signal to the potentially inverted signal arriving at each DAC. The first circuit, 302 is driven by the incoming data stream. The second circuit, 304, is driven with a negated version of the input signal, which is negated (or inverted) by inverter 306. At the output, outputs Vout1 and Vout2 (negated at the input of the differential amplifier 308) are received by differential output amplifier 308, giving outputs Aout and Aoutb (where "Aoutb" indicates bar, or negative, or opposite of "Aout").

At this point of the circuit, the output has a significant odd harmonic distortion. However, by application of a sinusoidal common mode signal, which may be 50 khz or more, the odd harmonics can be greatly suppressed, which may be as much as an additional 15 to 20 db. The reason is because the remaining harmonics are caused by changes in the derivative of the transfer characteristic and the average value, not the instantaneously value, is sampled as the CMV signal varies.

Figure 4:
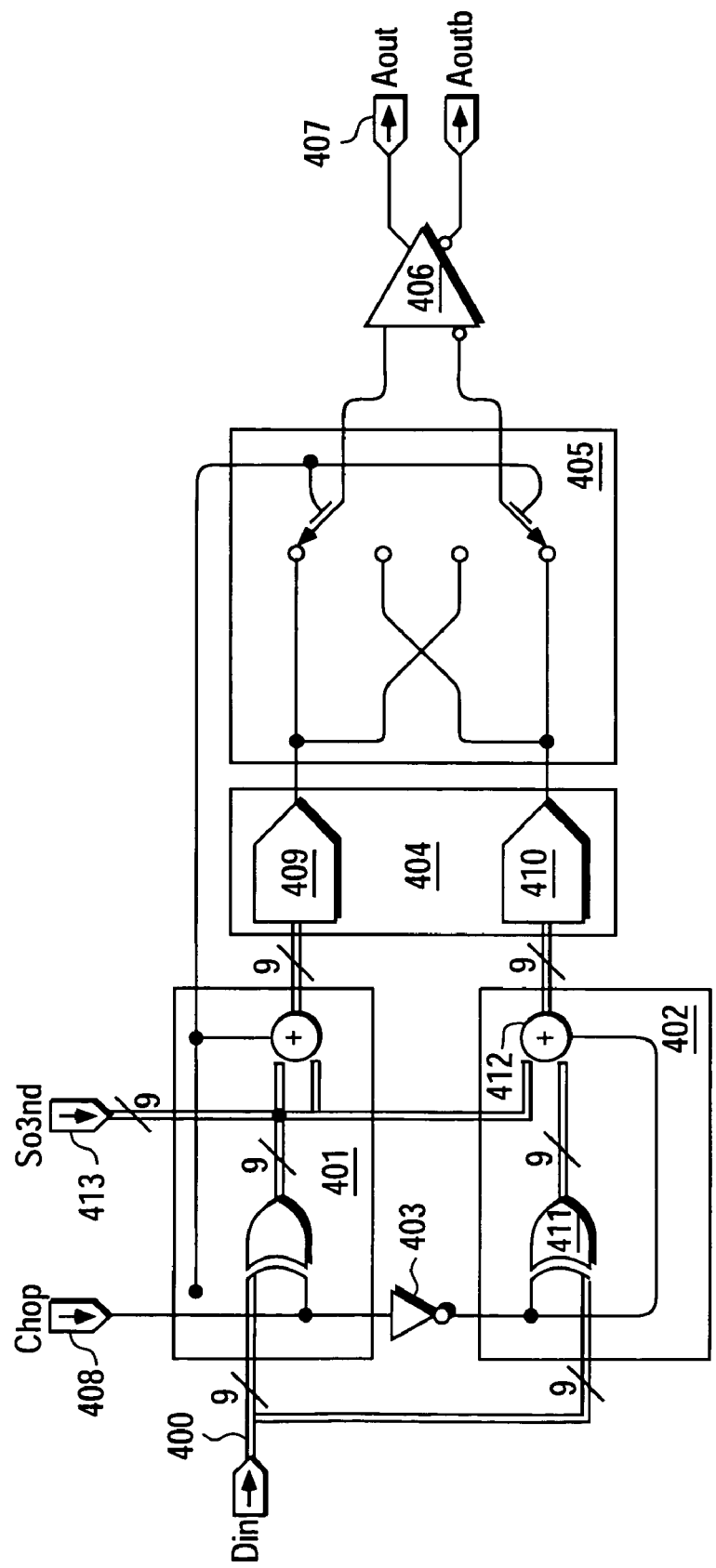
FIG. 4 is an illustration of an improved DAC according to the invention.

Referring to FIG. 4, yet another embodiment of the invention is illustrated. The circuit is configured to suppress both even and odd harmonics. The digital input is applied from the input bus 400 to the pair of DACs 404 via a pair of first and second multipliers 401 and 402. Each multiplier is capable of multiplying the digital signal by +1 or −1. The second multiplier 402 operates opposite to the first multiplier 401 because the inverter 403 inverts the control signal. Therefore, if the chopper input signal 408 is low the upper DAC 409 receives input data directly; the lower DAC 410 receives −1 multiplied by the input signal. The use of an exclusive OR logic gate 411 to generate the one's complement and addition of the chopper signal to the carry input of the adders 412 is shown as a convenient means to generate the 2's complement, or negation of the value. Thus, each multiplier is implemented as an exclusive OR per input bit of the digital input and makes use of the otherwise unused carry input of the adder to complete the 2's complement operation. Reversing switch arrangement 405 works in synchronicity with the chopper input and connects the DAC to the inverting or non-inverting input of the output amplifier 406. Therefore, as the chopper signal alternately inverts the input signal to each DAC, the inversion is removed by the chopper switch. No inversion is seen at the signal output 407. However, even harmonic terms of the error in the DACs are removed by the chopping action—they appear as frequency shifted signals adjacent to the chopper frequency. The action of the chopper and reversing switch has suppressed the even harmonic terms. The input port So3rd 413 operates to add a signal to the potentially inverted signal arriving at each DAC by use of the adders example 412 in each multiplier block 401 402. Since the DACs are operating differentially to the output 407 via the differential amplifier 406, the action of adding a signal to each DAC equally has no first order effect. Assuming each DAC were ideal, the addition of a signal to one would be cancelled because the same signal is added to the other, and the output signal is the difference between the DACS. However, in practice, each DAC is not ideal. Each DAC deviates from the ideal linear characteristic, and this deviation can be expressed as a polynomial sum of error terms. The effect of this additional signal is to cause each DAC to operate in a different part of its transfer characteristic, where some part of the characteristic has a error in one direction some part has an error in the opposite direction. The error signal from these different parts of the DAC characteristic will therefore by modulated by the addition signal. When the additional signal moves the DAC into a region of the transfer characteristic, where the error is positive, the output will have a positive error. Later, when the additional signal moves the DAC into a region of the transfer characteristic is negative, it will have negative error. The error, therefore, appears as tone that is one again, similar to the even harmonic errors, shifted to a frequency adjacent to the frequency of the additional input signal. For completeness, in the above discussion of this odd harmonic suppression, we did not consider the possibility that the characteristic may have at all points a positive error. If that where true, the method would not work, because the error would not be alternately driven positive and negative. However, this cannot arise because the chopper signal, even harmonic suppression method has removed any error signal that does not change sign, where that is an even harmonic on the DAC characteristic. Thus, the two techniques taken together, the chopper and the additional out of band signal, together suppress both even and odd harmonics.

The invention has been described in terms of a high quality DAC for a lower cost (including the layout size of the circuit on an audio chip) of high end DACs. This description has included particular embodiments for example and illustration of the invention. However, and again, the scope of the invention, however, is not limited to such embodiments, but rather is defined according to the scope of the appended claims and all equivalents.

What is claimed is:

1. A digital to analog converter (DAC) comprising:
   a first circuit configured to remove even harmonic errors from an output signal, the first circuit a first threshold value and a second threshold value, where the two threshold inputs define a threshold range that varies, and a switching circuit configured to reverse the threshold values between the first and second threshold inputs;
   a second circuit configured to remove odd harmonics from an output signal, the second circuit configured to receive a third threshold value and a fourth threshold value, wherein the third and fourth values vary, and a switching circuit configured to reverse the threshold values between the third and fourth threshold inputs; and
   an amplifier configured to receive an output from the first circuit and an inverted output from the second circuit, and configured to transmit an output signal.

2. A digital to analog converter comprising:
   a first circuit configured to remove even harmonic errors;
   a second circuit configured to eliminate odd harmonic errors; and
   a differential amplifier configured to receive an output from the first circuit and an inverted output of the second circuit and to generate an output signal.

3. A DAC according to claim 2, wherein the first circuit has a first DAC module configured with a first threshold input for receiving a first threshold value and a second threshold input for receiving a second threshold value.

4. A DAC according to claim 2, wherein the first circuit has a first DAC module configured with a first threshold input for receiving a first threshold value and a second threshold input for receiving a second threshold value, where the two threshold inputs define a threshold range that varies between a low voltage threshold and a high voltage threshold.

5. A DAC according to claim 2, wherein the first circuit has a switching circuit configured to reverse the threshold values between the first and second threshold inputs.

6. A DAC according to claim 2, the second circuit having a second DAC module configured with a third threshold input for receiving a third threshold value and a fourth threshold input for receiving a fourth threshold value, where the third and fourth threshold inputs define a threshold range that varies between a low voltage threshold and a high voltage threshold, and a switching circuit configured to reverse the threshold values between the first and second threshold inputs.

7. A DAC according to claim 2, the second circuit having a second DAC module configured with a third threshold input for receiving a third threshold value and a fourth threshold input for receiving a fourth threshold value.

8. A DAC according to claim 7, wherein the third and fourth threshold inputs define a threshold range that varies between a low voltage threshold and a high voltage threshold.

9. According to claim 7, wherein the second circuit has a switching circuit configured to reverse the threshold values between the first and second threshold inputs.

10. A method for making a digital to analog conversion, comprising:
    removing even harmonic errors with a first circuit;
    removing odd harmonic errors with a second circuit; and
    receiving an output from the first circuit and an inverted output of the second circuit and generating an output signal.

11. A method according to claim 10, further comprising receiving a first threshold value a second threshold value.

12. A method according to claim 10, further comprising receiving a first threshold value a second threshold value, where the two threshold inputs define a threshold range that varies between a low voltage threshold and a high voltage threshold.

13. A method according to claim 10, further comprising reversing the threshold values between the first and second threshold inputs.

14. A method according to claim 10, further comprising reversing the threshold values between the first and second threshold inputs with a switching circuit.

15. A method according to claim 10, wherein the output signal is generated by a differential amplifier.

16. A method according to claim 11, further comprising receiving a third threshold value with third threshold input and a fourth threshold input with a fourth threshold input, where the third and fourth threshold inputs define a threshold range that varies between a low voltage threshold and a high voltage threshold.

17. A method according to claim 12 wherein the third and fourth threshold value is received by a second DAC configured with a third and fourth threshold input.

18. A method according to claim 17, wherein the third and fourth thresholds are received by a second DAC module, and wherein the method further comprises reversing the threshold values between the first and second threshold inputs.

19. A method according to claim 10, further comprising receiving a third threshold value and a fourth threshold input for receiving a fourth threshold value with the second circuit.

20. A method according to claim 10, where the third and fourth threshold inputs define a threshold range that varies between a low voltage threshold and a high voltage threshold.

21. A method according to claim 10, further comprising reversing the threshold values between the first and second threshold inputs with switching circuit in the second circuit.

* * * * *